US010586654B2

United States Patent
MacDonald et al.

(10) Patent No.: US 10,586,654 B2
(45) Date of Patent: Mar. 10, 2020

(54) GLASS DIELECTRIC CAPACITORS AND MANUFACTURING PROCESSES FOR GLASS DIELECTRIC CAPACITORS

(71) Applicant: General Atomics, San Diego, CA (US)

(72) Inventors: James Ross MacDonald, San Diego, CA (US); Esteban Balarezo Bagdy, San Diego, CA (US); Mark Aoraha Cacause, El Cajon, CA (US); Mark Allen Schneider, San Diego, CA (US)

(73) Assignee: GENERAL ATOMICS, San Diego, CA (US)

( * ) Notice: Subject to any disclaimer, the term of this patent is extended or adjusted under 35 U.S.C. 154(b) by 112 days.

(21) Appl. No.: 15/851,658

(22) Filed: Dec. 21, 2017

(65) Prior Publication Data

US 2019/0198247 A1    Jun. 27, 2019

(51) Int. Cl.
| | |
|---|---|
| *B32B 38/00* | (2006.01) |
| *H01G 4/30* | (2006.01) |
| *B32B 17/06* | (2006.01) |
| *B32B 37/12* | (2006.01) |
| *H01G 4/232* | (2006.01) |
| *H01G 13/00* | (2013.01) |
| *H01J 37/32* | (2006.01) |

(52) U.S. Cl.
CPC .............. *H01G 4/30* (2013.01); *B32B 17/06* (2013.01); *B32B 37/12* (2013.01); *B32B 38/0008* (2013.01); *H01G 4/232* (2013.01); *H01G 13/006* (2013.01); *B32B 2255/26* (2013.01); *B32B 2307/202* (2013.01); *B32B 2309/105* (2013.01); *B32B 2457/16* (2013.01); *H01J 37/32* (2013.01); *H01J 2237/335* (2013.01)

(58) Field of Classification Search
CPC ...... H01G 4/30; B32B 17/06; B32B 38/0004; B32B 2457/26
See application file for complete search history.

(56) References Cited

U.S. PATENT DOCUMENTS

| | | | |
|---|---|---|---|
| 2,526,703 | A | 10/1950 | Smith |
| 3,310,392 | A | 3/1967 | Rhodes |
| 3,453,097 | A | 7/1969 | Hafner |

(Continued)

FOREIGN PATENT DOCUMENTS

| | | |
|---|---|---|
| GB | 1157123 | 7/1969 |
| WO | 2017150460 | 9/2017 |

OTHER PUBLICATIONS

Search Report for GB Patent Application No. GB1818943.1 mailed from the Intellectual Property Office of the UK dated May 16, 2019; search conducted May 15, 2019.

(Continued)

*Primary Examiner* — Mark A Osele
*Assistant Examiner* — Christopher C Caillouet
(74) *Attorney, Agent, or Firm* — Fitch, Even, Tabin & Flannery LLP

(57) ABSTRACT

A method for making a glass dielectric capacitor may include providing a plurality of foil sheets, cutting each of the plurality of foil sheets with a laser beam by melting each of the plurality of foil sheets, forming a respective smooth foil edge on each of said plurality of foil sheets during the cutting, providing a plurality of glass sheets, and stacking the plurality of foil sheets in alternating layers with the plurality of glass sheets.

22 Claims, 13 Drawing Sheets

(56) References Cited

U.S. PATENT DOCUMENTS

| | | | |
|---|---|---|---|
| 3,885,943 A | 5/1975 | Chui | |
| 4,687,540 A * | 8/1987 | Singhdeo | ............... H01G 4/105 |
| | | | 216/105 |
| 8,524,139 B2 | 9/2013 | Toth | |
| 8,943,855 B2 | 2/2015 | Gomez | |
| 9,221,124 B2 | 12/2015 | Albelo | |
| 2002/0033558 A1 | 3/2002 | Fahey | |
| 2006/0108327 A1 | 5/2006 | Chng | |
| 2010/0301013 A1 | 12/2010 | Conneely | |
| 2015/0165560 A1 | 6/2015 | Hackert | |
| 2017/0267568 A1 | 9/2017 | Wilke | |

OTHER PUBLICATIONS

Choi et al; "Thermal Cleavage on Glass by a Laser-Induced Plume"; Optics and Lasers in Engineering 53; Feb. 2014; pp. 60-68.

\* cited by examiner

GLASS DIELECTRIC CAPACITORS AND MANUFACTURING PROCESSES FOR GLASS DIELECTRIC CAPACITORS

BACKGROUND OF THE INVENTION

1. Field of the Invention

The present invention relates generally to making dielectric capacitors, and more specifically to making glass dielectric capacitors using sheets of glass, foil, hybrid metalized glass, or combinations thereof.

2. Discussion of the Related Art

Various systems and processes are known in the art for making glass dielectric capacitors. A capacitor is an electrical component that stores energy in an electric field. In some examples, capacitors may contain two or more electrical conductors mechanically separated by a dielectric to prevent the conductors from contacting. These conductors may be in the form of metal plates or sheets. As charge moves through a circuit containing a capacitor and a voltage source, electrons accumulate on one of the sheets. Capacitors may be used to store energy, to create a pulse of energy, to smooth current, to couple or decouple signals, and for other purposes.

Dielectric material may be used to separate the conductors in a capacitor. Dielectric materials include glass, ceramic, polymers, paper, mica, or oxides. The type of material used may affect properties of the capacitor, including its capacity for charge (capacitance), the amount of voltage that may be applied before failing, and the operating temperature of the capacitor.

A capacitor may fail once it can no longer hold a charge, which may happen when its dielectric becomes conductive (e.g., at a certain temperature), or after degradation of the material. Specifically, in some cases capacitors may generate high temperatures under continuous operation. This may make them unsuitable for some continuous high voltage operations.

SUMMARY

Methods for making glass dielectric capacitors are described. In a first example of a stacked glass/foil capacitor, individual foil sheets may alternate with glass sheets. The glass sheets may have a thickness of from between 4 μm and 100 μm. In a second example of a stacked glass/foil capacitor, glass sheets may alternate with two foil sheets. In a stacked glass/foil capacitor, a voltage may be applied to the capacitor to permanently adhere the foil sheets to each glass sheet. In a stacked metalized glass capacitor, a metal layer (e.g., gold or gallium) may be deposited on both sides of a glass sheet to form a hybrid metalized glass sheet. In a stacked hybrid electrode capacitor, hybrid metalized glass sheets may be alternated with one or more foil sheets to form the capacitor.

In one embodiment, a method may include providing a plurality of foil sheets of 4 micrometers to 25 micrometers thickness, cutting each of the plurality of foil sheets with a laser beam by melting each of the plurality of foil sheets, forming a respective smooth foil edge on each of said plurality of foil sheets during the cutting, providing a plurality of glass sheets, and stacking the plurality of foil sheets in alternating layers with the plurality of glass sheets. Alternatively, or in addition, the foil electrodes may be cut, for example, by die cutting or blade cutting (such as cutting with the razor blade). The foil sheets may, for example, include aluminum, copper, gold, silver or combinations thereof.

In one embodiment, a non-transitory computer-readable medium may include instructions operable to cause a processor to provide a plurality of foil sheets of 4 micrometers to 25 micrometers thickness, cut each of the plurality of foil sheets with a laser beam by melting each of the plurality of foil sheets, form a respective smooth foil edge on each of said plurality of foil sheets during the cutting, provide a plurality of glass sheets, and stack the plurality of foil sheets in alternating layers with the plurality of glass sheets.

In one embodiment, a system may include one or more components configured to provide a plurality of foil sheets of 4 micrometers to 25 micrometers thickness, cut each of the plurality of foil sheets with a laser beam by melting each of the plurality of foil sheets, form a respective smooth foil edge on each of said plurality of foil sheets during the cutting, provide a plurality of glass sheets, and stack the plurality of foil sheets in alternating layers with the plurality of glass sheets.

In one embodiment, an apparatus may include means for providing a plurality of foil sheets of 4 micrometers to 25 micrometers thickness, means for cutting each of the plurality of foil sheets with a laser beam by melting each of the plurality of foil sheets, means for forming a respective smooth foil edge on each of said plurality of foil sheets during the cutting, means for providing a plurality of glass sheets, and means for stacking the plurality of foil sheets in alternating layers with the plurality of glass sheets.

In some examples of the method, non-transitory computer-readable medium, system, and apparatus described above, said stacking comprises stacking two or more of said plurality of foil sheets between alternating layers of the plurality of glass sheets.

Some examples of the method, non-transitory computer-readable medium, system, and apparatus described above may further include processes, features, means, or instructions for depositing a metalized layer on both sides of each one of the plurality of glass sheets prior to said stacking of said plurality of foil sheets in alternating layers with said plurality of glass sheets. In some examples of the method, non-transitory computer-readable medium, system, and apparatus described above, said depositing of said metalized layer comprises depositing said metalized layer on an area of each of said plurality of glass sheets that extends beyond an area of each of said plurality of glass sheets juxtaposed respectively to one of said plurality of foil sheets.

In some examples of the method, non-transitory computer-readable medium, system, and apparatus described above, said stacking comprises stacking said plurality of foil sheets in alternating layers with the plurality of glass sheets with said plurality of foil sheets extending out beyond a respective edge of each of said plurality of glass sheets, wherein an extended portion of each of said plurality of foil sheets allows for attachment of a terminal.

In some examples of the method, non-transitory computer-readable medium, system, and apparatus described above, said stacking comprises stacking said plurality of foil sheets in alternating layers with said plurality of glass sheets offset from one another.

Some examples of the method, non-transitory computer-readable medium, system, and apparatus described above may further include processes, features, means, or instructions for depositing metal on a side of the plurality of glass sheets.

Some examples of the method, non-transitory computer-readable medium, system, and apparatus described above may further include processes, features, means, or instructions for depositing electrically conductive epoxy on a side of the plurality of glass sheets.

Some examples of the method, non-transitory computer-readable medium, system, and apparatus described above may further include processes, features, means, or instructions for depositing a conductive layer on a side of the plurality of glass sheets. For example, the electrically conductive layer may be a conductive metal deposited onto the sides of the glass sheets using an arc spray or cold spray procedure.

Some examples of the method, non-transitory computer-readable medium, system, and apparatus described above may further include processes, features, means, or instructions for coupling a terminal to said conductive layer.

Some examples of the method, non-transitory computer-readable medium, system, and apparatus described above may further include processes, features, means, or instructions for submerging the glass sheets having been stacked in an electrical insulating liquid.

In some examples of the method, non-transitory computer-readable medium, system, and apparatus described above, said submerging comprises submerging under vacuum.

In some examples of the method, non-transitory computer-readable medium, system, and apparatus described above, said submerging comprises submerging said glass sheets having been stacked in a liquid selected from the group of liquids comprising: silicone fluid, mineral oil, synthetic ester, vegetable oil, rapeseed oil, aromatic insulating fluid (such as biphenyls) and combinations thereof.

Some examples of the method, non-transitory computer-readable medium, system, and apparatus described above may further include processes, features, means, or instructions for applying a voltage across separate ones of said plurality of foil sheets.

Some examples of the method, non-transitory computer-readable medium, system, and apparatus described above may further include processes, features, means, or instructions for applying said voltage across said separate ones of said plurality of foil sheets by pulsing said voltage.

Some examples of the method, non-transitory computer-readable medium, system, and apparatus described above may further include processes, features, means, or instructions for applying said voltage under vacuum.

Some examples of the method, non-transitory computer-readable medium, system, and apparatus described above may further include processes, features, means, or instructions for coating each of said plurality of glass sheets with polymer coating prior to said stacking.

Some examples of the method, non-transitory computer-readable medium, system, and apparatus described above may further include processes, features, means, or instructions for coating each of said plurality of glass sheets with inorganic ceramic coating prior to said stacking.

Some examples of the method, non-transitory computer-readable medium, system, and apparatus described above may further include processes, features, means, or instructions for plasma cleaning the plurality of glass sheets and the plurality of foil sheets.

Some examples of the method, non-transitory computer-readable medium, system, and apparatus described above may further include processes, features, means, or instructions for placing into a vacuum furnace the plurality of glass sheets and the plurality of foil sheets.

Some examples of the method, non-transitory computer-readable medium, system, and apparatus described above may further include processes, features, means, or instructions for cleaning the plurality of glass sheets prior to said stacking.

Some examples of the method, non-transitory computer-readable medium, system, and apparatus described above may further include processes, features, means, or instructions for cleaning the plurality of foil sheets prior to said stacking.

DETAILED DESCRIPTION

Figure 1:
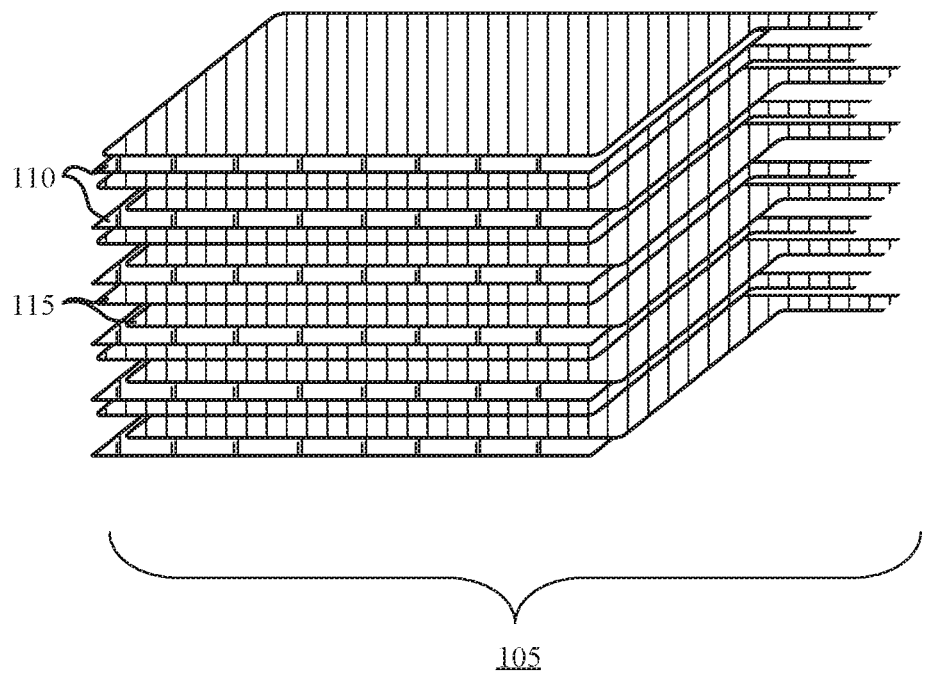
FIG. 1 shows a diagram of a stacked glass/foil capacitor.

The following description is not to be taken in a limiting sense, but is made merely for the purpose of describing the general principles of exemplary embodiments. The scope of the invention should be determined with reference to the claims.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

In some cases, capacitors may generate high temperatures under continuous operation. For example, continuous operation of high voltage or high energy density capacitors may generate temperatures that exceed 150° C. The temperature limits of the capacitor may depend on the type of dielectric material used. Polymer/foil capacitors may break down at temperatures as low as 80° C.-100° C. This may make them unsuitable for some continuous high voltage operations. Glass dielectric capacitors may be used for high temperature applications. For example, glass dielectric capacitors may survive temperatures up to 400° C.

Glass coatings may increase the mechanical strength of a glass dielectric capacitor. For example, the glass may be dipped in a cyanoresin polymer solution and dried (e.g., at 100° C.). In another example, the glass may be metalized. An inorganic ceramic coating may increase mechanical strength and resistance to breakdown (i.e., through the blocking of charge injection).

Additionally, or alternatively, an insulating inorganic coating applied over the outside edge of the metalized electrode may increase flashover resistance and breakdown strength by blocking charge movement in certain areas. Plasma treatment may also increase glass capacitor breakdown strength. In one example, a glass capacitor with either tin or lead foil is placed in a plasma cleaner with CF4 gas. When a plasma is formed from the gas, compounds may accumulate on the edge of the electrode which may increase the breakdown strength. The compounds may also prevent charge emission from the electrode edge.

Irregularities such as asperities on the edge of a foil sheet or particulate contamination may contribute to dielectric breakdown. In some examples, foil sheets may be cut with a laser to produce a smooth edge and reduce asperities. Capacitors may also be cleaned to remove particulate contamination. For example, capacitors may be cleaned using an ultrasonic cleaning procedure. In another example, particles may be blown off the glass using compressed nitrogen. In yet another example, the particles may be debrided from the surface of the glass using pressurized CO2 ice. In yet another example, surfaces of the capacitor may be wiped with a solvent-wetted cloth. To clean the foil component, the capacitor may be wiped with a solvent on a smooth sheet of metal or glass. This may also smooth out any wrinkles in the foil that may cause air bubbles or breakdown sites.

Referring to FIG. 1, shown is a diagram 100 of a stacked glass/foil capacitor 105. In some examples, stacked glass/foil capacitor 105 may include glass sheets 110 and foil sheets 115. Foil sheet 115 may be made of aluminum, lead, tin or any other suitable metal, and incorporate aspects of foil sheet 315 as described with reference to FIG. 3.

In a first example (not shown) of a stacked glass/foil capacitor 105, individual foil sheets 115 may alternate with glass sheets 110. In this example, the foil sheets 115 may become electrostatically stuck to one of the adjacent glass sheets 110, which may cause capacitance to vary significantly.

In a second example (as illustrated) of a stacked glass/foil capacitor 105, glass sheets 110 may be alternated with two foil sheets 115. In this example, each foil sheet 115 is adjacent to (and thus, may adhere to) a single glass sheet 110. This may significantly improve capacitance or reduce variation in capacitance between layers.

In a stacked glass/foil capacitor 105, a voltage may be applied to the capacitor to permanently adhere the foil sheets 115 to each glass sheet 110. For example, a 4.5 kV rated glass capacitor may be treated with a constant voltage of 2 kV for 30 minutes, or a pulsed 2.5 kV at 50 Hz. In some cases, the voltage may result in the growth of a high permittivity metal oxide coating on the edge of the electrode. This may passivate asperities on the foil edge, which may prevent breakdown.

The voltage treatment may be applied under vacuum to ensure all air bubbles are removed between the foil sheet 115 and the glass sheet 110. Optionally, the voltage treated stacked glass/foil capacitor 105 may then be placed in a vacuum and submerged in an electrical insulating liquid to fill any gaps between the glass sheet 110 and foil sheets 115. The electrical insulating liquid may be silicone oil, mineral oil, rapeseed oil, or another capacitor impregnant. In some examples, fluorinated liquids (e.g., Fluorinert or Novec) may be used.

The capacitor may then be sealed hermetically to preserve the impregnation process. This process may be performed on double foil glass capacitors that have undergone voltage treatment, to prevent impregnation material from getting in between the foil and glass. The impregnation process may increase the breakdown strength of the capacitor.

In another example, thermal bonding may be used on the stacked glass/foil capacitor 105, and may remove the need for an impregnant between the layers. A capacitor stack may be placed in a vacuum furnace and heated to beyond its glass transition temperature. The glass layers would partially melt, slightly fusing with adjacent layers to create a solid glass capacitor. This assembly may be cooled very slowly thereafter to prevent mechanical stress.

In yet another example, the stacked glass/foil capacitor 105 may be operated in a pressurized gaseous environment. Operation in this environment may significantly increase the breakdown strength of a capacitor relative to atmosphere or liquid impregnates. The pressurized gas prevents charge emission from the electrodes, which may cause glass capacitors to break down. Suitable gasses may include sulfur hexafluoride (SF6). The capacitors may be provided in a case filled with pressurized gas, or used in an environment that is already pressurized.

Figure 2:
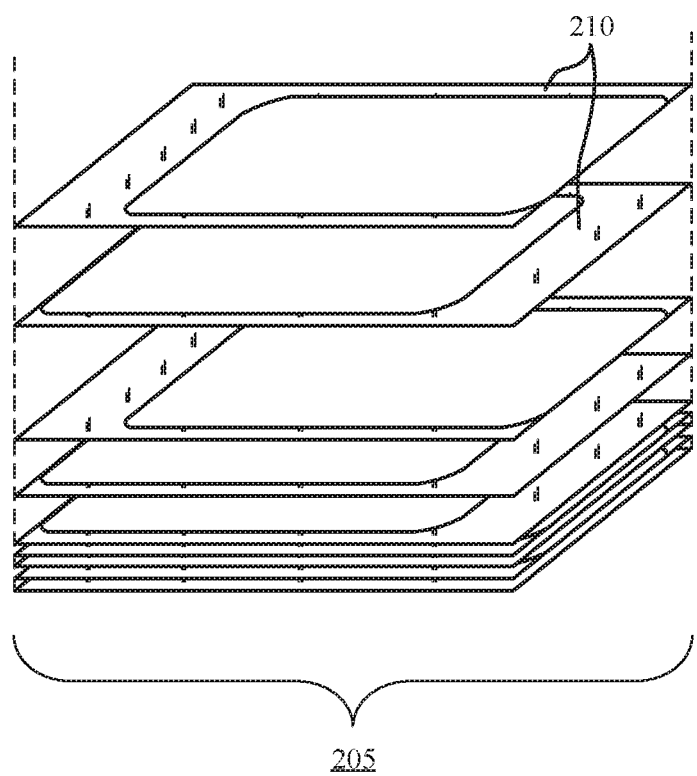
FIG. 2 shows a diagram of a stacked metalized glass capacitor.

Referring next to FIG. 2, shown is a diagram 200 of a stacked metalized glass capacitor 205. In some examples, stacked metalized glass capacitor 205 may include stacked hybrid metalized glass sheets 210. Hybrid metalized glass sheets 210 may incorporate aspects of hybrid metalized glass sheet 310 as described with reference to FIG. 3.

In a stacked metalized glass capacitor 205, a metal layer (e.g., gold or gallium) may be deposited on both sides of a glass sheet to form a hybrid metalized glass sheet 210. The metal layer may be formed with a thickness of greater than 500 nm. In some cases, hybrid metalized glass sheets 210 may be stacked without foil sheets (as described with reference to FIG. 3). In some cases, the hybrid metalized glass sheets 210 may be offset laterally.

Conductive material may be deposited on the edges of the glass sheets to electrically connect the layers (e.g., using a flame spray, a cold spray or sputter procedure). In some cases, terminals may be soldered or adhered to the conductive material using electrically conductive epoxy or adhesive. The solder process may include a solder preform, which is a piece of material wetting the metal layer on the glass sheet when the assembly is heated. Gallium may be an example of a material suitable for wetting the glass (and hence, may be used for the solder preform).

Figure 3:
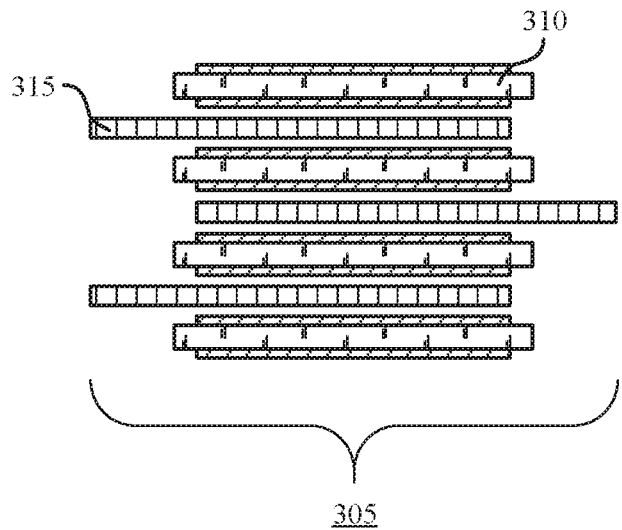
FIG. 3 shows a diagram of a stacked hybrid electrode capacitor.
Figure 3:
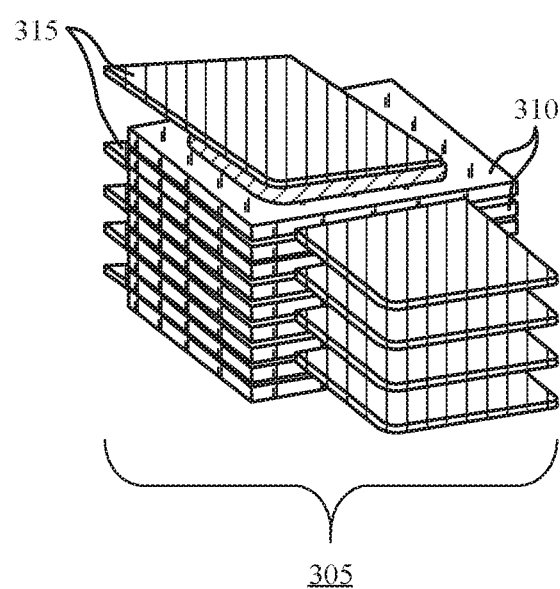

Referring to FIG. 3, shown is a diagram 300 of a stacked hybrid electrode capacitor 305. In some examples, the stacked hybrid electrode capacitor 305 may include hybrid metalized glass sheets 310 stacked with foil sheets 315. The hybrid metalized glass sheet 310 may incorporate aspects of the hybrid metalized glass sheet 210 as described with reference to FIG. 2. The foil sheet 315 may incorporate aspects of foil sheet 115 as described with reference to FIG. 1.

In a stacked hybrid electrode capacitor 305, hybrid metalized glass sheets 310 may be alternated with one or more foil sheets 315 to form the capacitor. In some cases, the foil sheets 315 may extend out of the capacitor to allow attachment of terminals. In some cases, a stacked hybrid electrode capacitor 305 may be voltage treated as described above.

Figure 4:
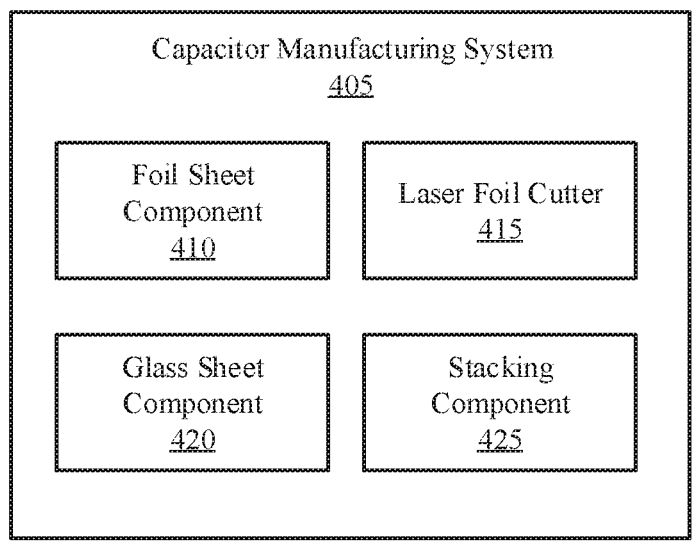
FIGS. 4 through 5 show diagrams of a capacitor manufacturing system that supports making glass dielectric capacitors using sheets of glass, foil, hybrid metalized glass, or combinations thereof in accordance with aspects of the present disclosure.

Referring to FIG. 4, shown is a diagram 400 of a capacitor manufacturing system 405 that supports making glass dielectric capacitors using sheets of glass, foil, hybrid metalized glass, or combinations thereof in accordance with aspects of the present disclosure.

Capacitor manufacturing system 405 may incorporate aspects of the capacitor manufacturing system 505 as described with reference to FIG. 5. In some examples, the capacitor manufacturing system 405 may include a foil sheet component 410, a laser foil cutter 415, a glass sheet component 420, and a stacking component 425.

The foil sheet component 410 may provide a plurality of foil sheets (e.g., of 4 micrometers to 25 micrometers thickness). The foil sheet component 410 may incorporate aspects of the foil sheet component 510 as described with reference to FIG. 5.

The laser foil cutter 415 may cut each of the plurality of foil sheets with a laser beam by melting each of the plurality of foil sheets, thereby forming a respective smooth foil edge on each of the plurality of foil sheets during the cutting. The laser foil cutter 415 may incorporate aspects of the laser foil cutter 515 as described with reference to FIG. 5. Alternatively, or in addition, some or all of the plurality of foil sheets may be cut by die cutting or blade cutting (such as with a razor blade).

The glass sheet component 420 may provide a plurality of glass sheets (which may be metalized glass sheets as described above). The glass sheet component 420 may incorporate aspects of the glass sheet component 520 as described with reference to FIG. 5.

The stacking component 425 may stack the plurality of foil sheets in alternating layers with the plurality of glass sheets. The stacking component 425 may also stack metalized glass sheets without foil sheets between them. The stacking component 425 may incorporate aspects of the stacking component 525 as described with reference to FIG. 5.

In some cases, the stacking comprises stacking two or more of the plurality of foil sheets between alternating layers of the plurality of glass sheets. In some cases, the stacking comprises stacking the plurality of foil sheets in alternating layers with the plurality of glass sheets with the plurality of foil sheets extending out beyond a respective edge of each of the plurality of glass sheets, wherein an extended portion of each of the plurality of foil sheets allows for attachment of a terminal. In some cases, the stacking comprises stacking the plurality of foil sheets in alternating layers with the plurality of glass sheets with the plurality of glass sheets offset from one another.

Figure 5:
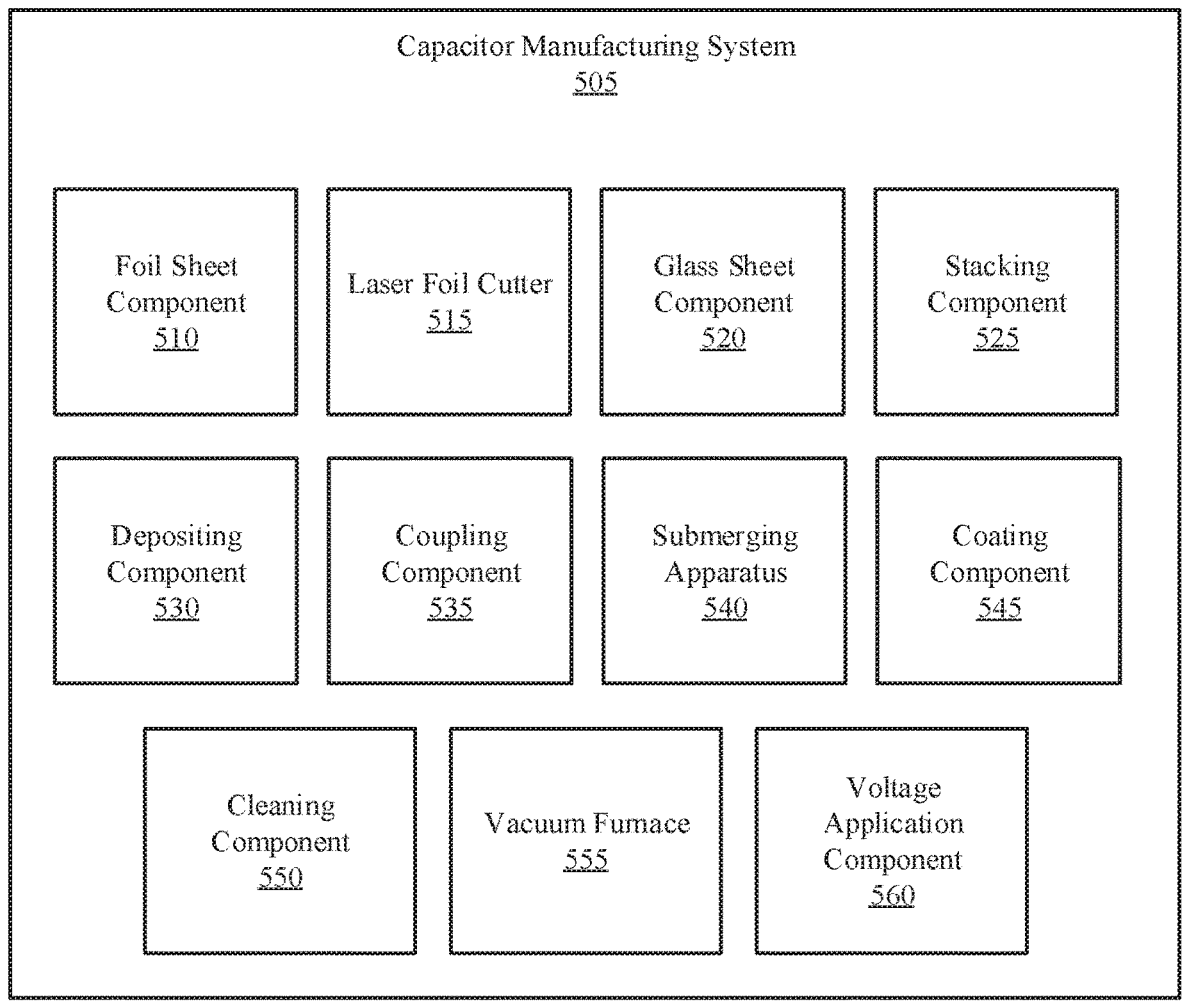

Referring to FIG. 5, shown is a diagram 500 of a capacitor manufacturing system 505 that supports making a glass dielectric capacitor using sheets of glass, foil, hybrid metalized glass, or combinations thereof in accordance with aspects of the present disclosure.

The capacitor manufacturing system 505 may incorporate aspects of the capacitor manufacturing system 405 as described with reference to FIG. 4. In some examples, the capacitor manufacturing system 505 may include: a foil sheet component 510, a laser foil cutter 515, a glass sheet component 520, and a stacking component 525. Optionally, the capacitor manufacturing system 505 may also include a depositing component 530, a coupling component 535, a submerging apparatus 540, a coating component 545, a cleaning component 550, a vacuum furnace 555, and a voltage application component 560.

The foil sheet component 510 may provide a plurality of foil sheets. The foil sheet component 510 may incorporate aspects of the foil sheet component 410 as described with reference to FIG. 4.

The laser foil cutter 515 may cut each of the plurality of foil sheets with a laser beam. The laser foil cutter 515 may incorporate aspects of the laser foil cutter 415 as described with reference to FIG. 4.

The glass sheet component 520 may provide a plurality of glass sheets. The glass sheet component 520 may incorporate aspects of the glass sheet component 420 as described with reference to FIG. 4.

The stacking component 525 may stack the plurality of foil sheets in alternating layers with the plurality of glass sheets. The stacking component 525 may incorporate aspects of stacking component 425 as described with reference to FIG. 4.

The depositing component 530 may deposit a metalized layer on both sides of each one of the plurality of glass sheets prior to the stacking of the plurality of foil sheets in alternating layers with the plurality of glass sheets; deposit metal on a side of the plurality of glass sheets having been stacked; deposit electrically conductive epoxy on a side of the plurality of glass sheets having been stacked; and deposit a conductive layer on a side of the plurality of glass sheets having been stacked.

In some cases, the depositing of the metalized layer comprises depositing the metalized layer on an area of each of the plurality of glass sheets that extends beyond an area of each of the plurality of glass sheets juxtaposed respectively to one of the plurality of foil sheets.

The coupling component 535 may couple a terminal to the conductive layer.

The submerging apparatus 540 may submerge the glass sheets having been stacked in an electrical insulating liquid. In some cases, the submerging comprises submerging under vacuum. In some cases, the submerging comprises submerging the glass sheets having been stacked in a liquid selected from the group of liquids comprising: silicone fluid, mineral oil, synthetic ester, vegetable oil, rapeseed oil, aromatic insulating fluid (such as biphenyls) and combinations thereof.

The coating component 545 may coat each of the plurality of glass sheets with polymer coating prior to the stacking and coat each of the plurality of glass sheets with inorganic ceramic coating prior to the stacking.

The cleaning component 550 may plasma clean the plurality of glass sheets and the plurality of foil sheets having been stacked or prior to the stacking. In some cases the cleaning comprises plasma cleaning.

The vacuum furnace 555 may be used to burn away undesired material or particles from a stacked glass capacitor. For example, the capacitor manufacturing system 505 may place into a vacuum furnace 555 the plurality of glass sheets and the plurality of foil sheets before or after the stacking.

The voltage application component 560 may apply a voltage across separate ones of the plurality of foil sheets. The voltage may be pulsed or applied under vacuum, or both.

Figure 6:
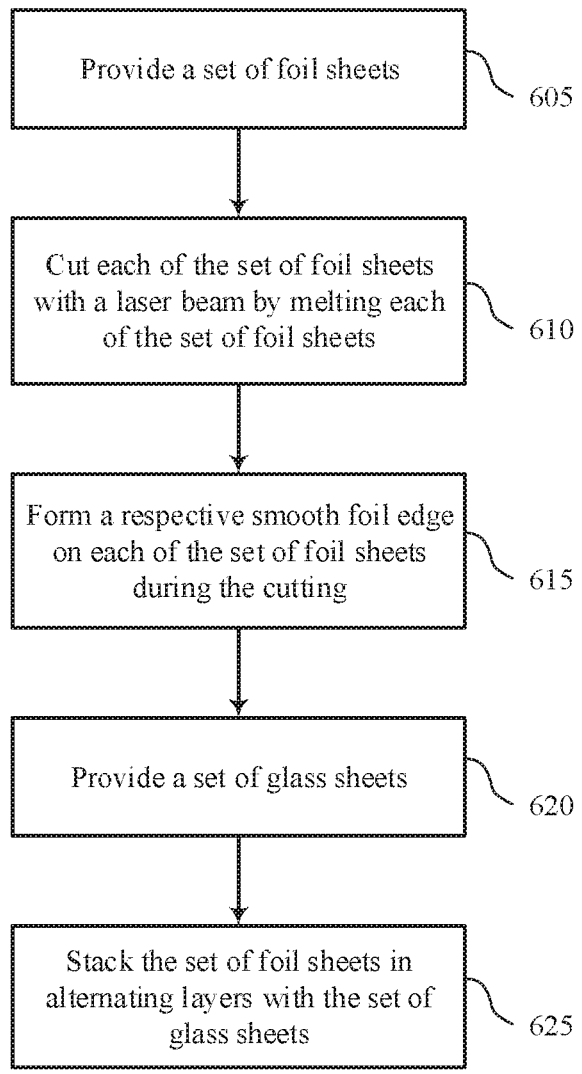
FIGS. 6 through 13 show flowcharts of a process for making glass dielectric capacitors using sheets of glass, foil, hybrid metalized glass, or combinations thereof in accordance with aspects of the present disclosure.

Referring to FIG. 6, shown is a flowchart 600 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 605 the capacitor manufacturing system may provide a plurality of foil sheets of 4 micrometers to 25 micrometers thickness. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 610 the capacitor manufacturing system may cut each of the plurality of foil sheets with a laser beam by melting each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 615 the capacitor manufacturing system may form a respective smooth foil edge on each of the plurality of foil sheets during the cutting. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 620 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 625 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

Figure 7:
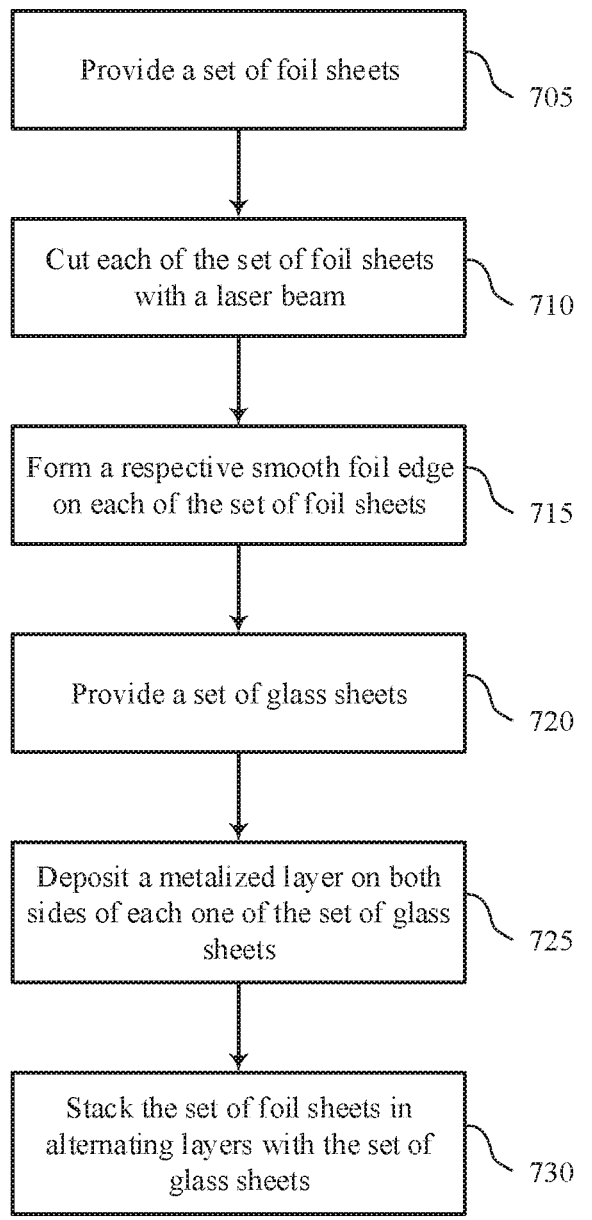

Referring to FIG. 7, shows a flowchart 700 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 705 the capacitor manufacturing system may provide a plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 710 the capacitor manufacturing system may cut each of the plurality of foil sheets with a laser beam. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 715 the capacitor manufacturing system may form a respective smooth foil edge on each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 720 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 725 the capacitor manufacturing system may deposit a metalized layer on both sides of each one of the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the depositing component 530 as described with reference to FIG. 5.

At block 730 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

Figure 8:
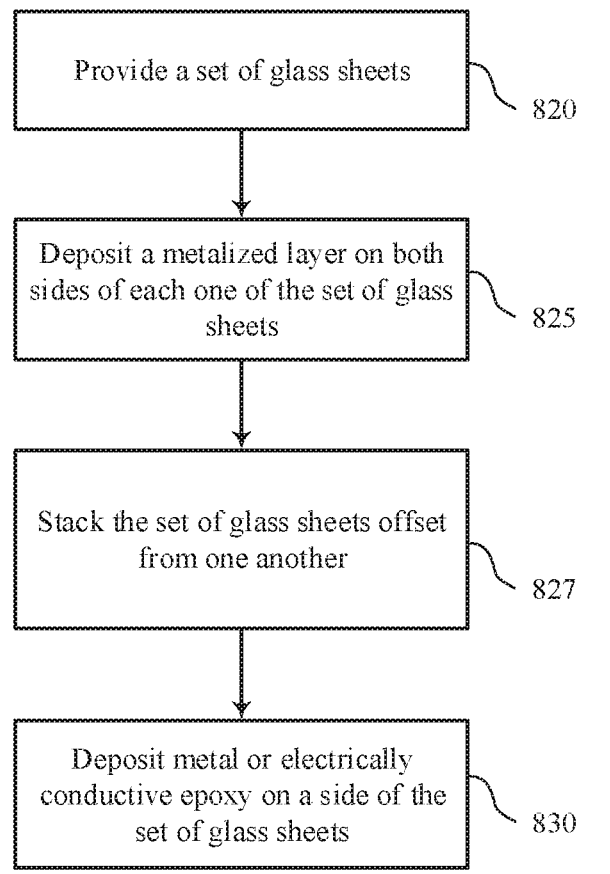

Referring to FIG. 8, shown is a flowchart 800 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 820 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 825 the capacitor manufacturing system may deposit a metalized layer on both sides of each one of the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the depositing component 530 as described with reference to FIG. 5.

At block 827 the capacitor manufacturing system may stack the plurality glass sheets with the plurality of glass sheets offset from one another. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

At block 830 the capacitor manufacturing system may deposit metal or electrically conductive epoxy on a side of the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the depositing component 530 as described with reference to FIG. 5.

In operation, the glass sheets each may be placed into a fixture that covers only the edges (for example, margins at the periphery) of the glass sheets. The fixture has a hole in the middle of the fixture that exposes an area of the surface of the glass sheet in the desired shape of the metal to be deposited. When metal is deposited the fixture covers the edges (for example, margins) so no metal is deposited at the edges (for example, margins). When the glass is removed from the fixture no metal is around the edges, so as to prevent shorting of the resulting capacitor.

Figure 9:
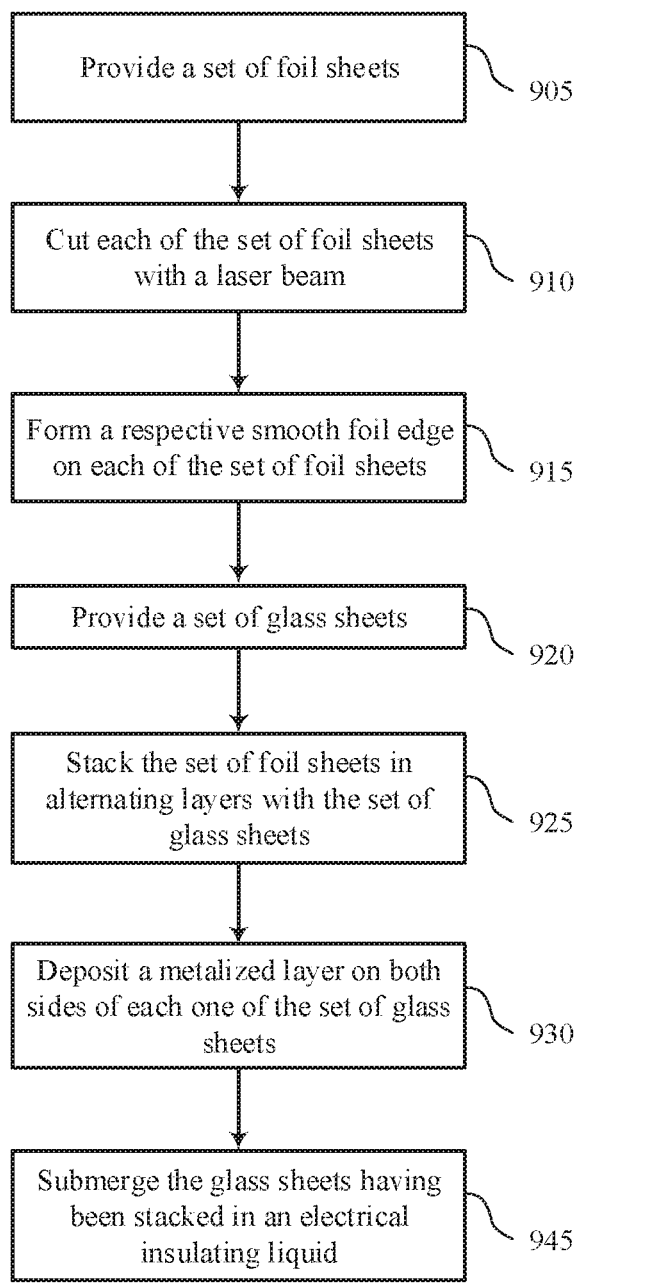

Referring to FIG. 9, shown is a flowchart 900 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 905 the capacitor manufacturing system may provide a plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 910 the capacitor manufacturing system may cut each of the plurality of foil sheets with a laser beam. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 915 the capacitor manufacturing system may form a respective smooth foil edge on each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 920 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 925 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

At block 930 the capacitor manufacturing system may deposit a metalized layer on both sides of each one of the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the depositing component 530 as described with reference to FIG. 5.

At block 945 the capacitor manufacturing system may submerge the glass sheets having been stacked in an electrical insulating liquid. These operations may be performed according to the methods and processes described in accordance with aspects of the present disclosure. For example, the operations may be composed of various substeps, or may be performed in conjunction with other operations described herein. In certain examples, aspects of the described operations may be performed by the submerging apparatus 540 as described with reference to FIG. 5.

Figure 10:
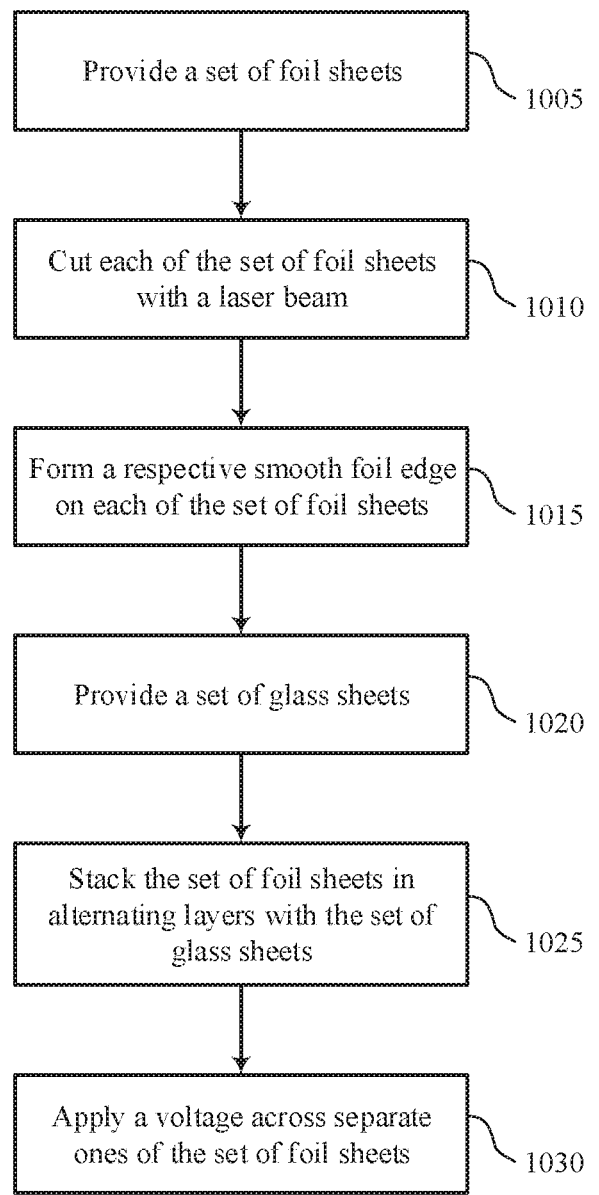

Referring to FIG. 10, shown is a flowchart 1000 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 1005 the capacitor manufacturing system may provide a plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 1010 the capacitor manufacturing system may cut each of the plurality of foil sheets with a laser beam. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1015 the capacitor manufacturing system may form a respective smooth foil edge on each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1020 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 1025 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

At block 1030 the capacitor manufacturing system may apply a voltage across separate ones of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the voltage application component 560 as described with reference to FIG. 5.

Figure 11:
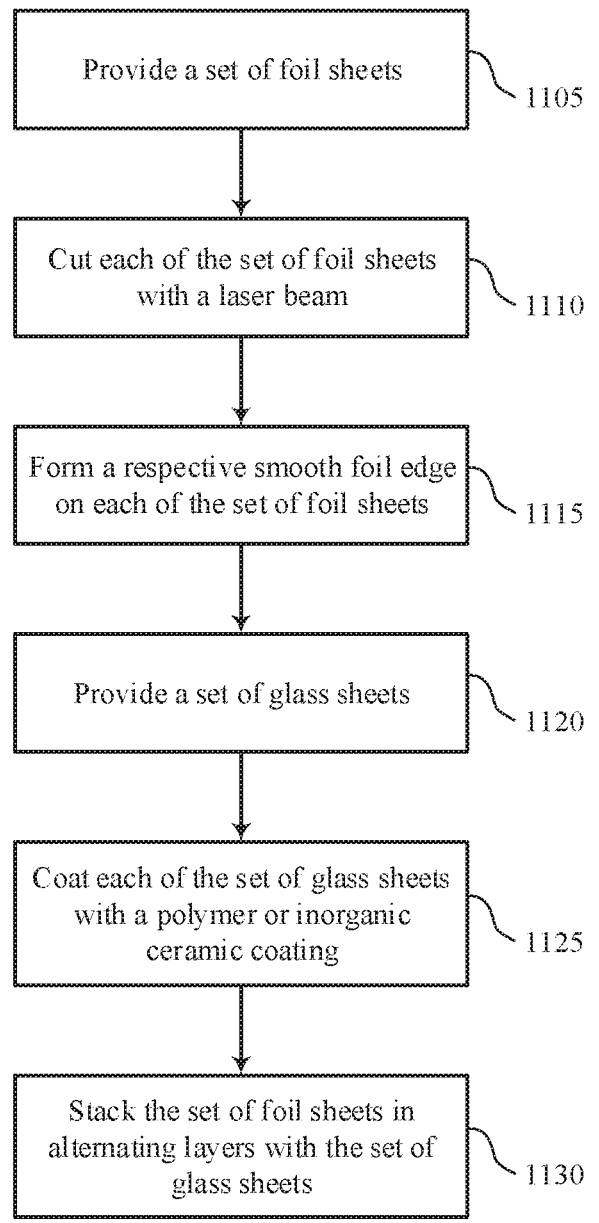

Referring to FIG. 11, shown is a flowchart 1100 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that performs the described functions. Additionally, or alternatively, a capacitor manufacturing system may use special-purpose hardware.

At block 1105 the capacitor manufacturing system may provide a plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 1110 the capacitor manufacturing system may cut each of the plurality of foil sheets with a laser beam. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1115 the capacitor manufacturing system may form a respective smooth foil edge on each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1120 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 1125 the capacitor manufacturing system may coat each of the plurality of glass sheets with a polymer or inorganic ceramic coating. These operations may be performed according to the methods and processes described in accordance with aspects of the present disclosure. For example, the operations may be composed of various substeps, or may be performed in conjunction with other operations described herein. In certain examples, aspects of the described operations may be performed by the coating component 545 as described with reference to FIG. 5.

At block 1130 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

Figure 12:
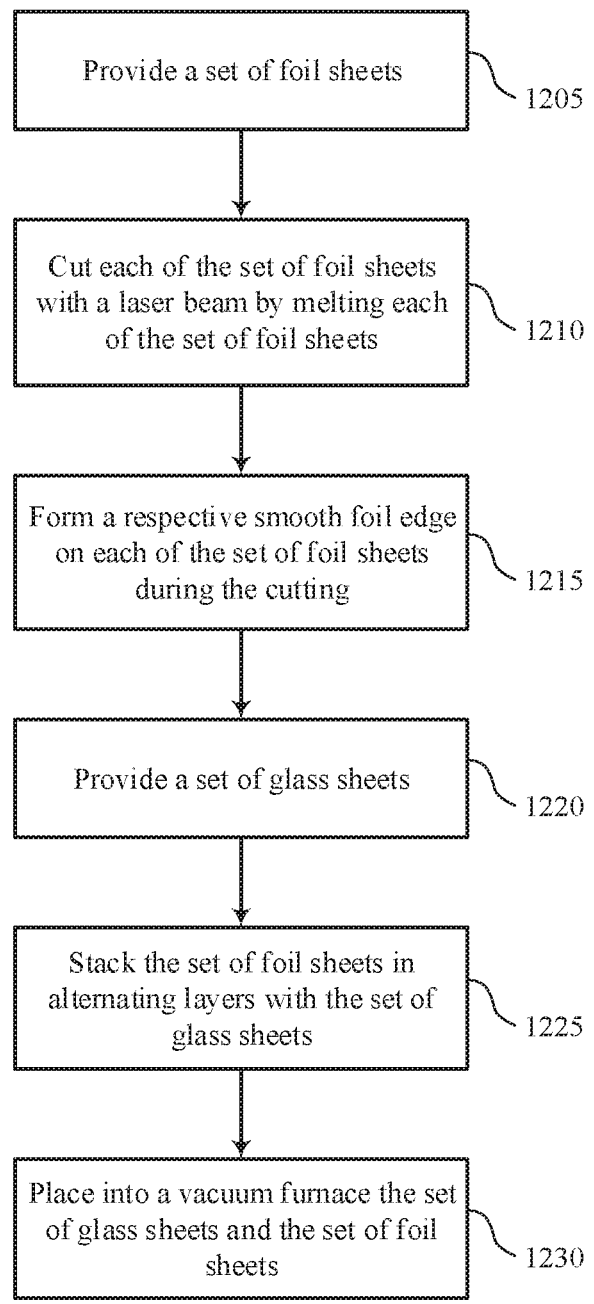

Referring to FIG. 12, shown is a flowchart 1200 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 1205 the capacitor manufacturing system may provide a plurality of foil sheets of 4 micrometers to 25 micrometers thickness. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 1210 the capacitor manufacturing system may cut each of the plurality of foil sheets with a laser beam by melting each of the plurality of foil sheets. Alternatively, or in addition, some of all of the foil sheets may be die cut or blade cut (for example with the razor blade). These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1215 the capacitor manufacturing system may form a respective smooth foil edge on each of the plurality of foil sheets during the cutting. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1220 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 1225 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

At block 1230 the capacitor manufacturing system may place into a vacuum furnace the plurality of glass sheets and the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the vacuum furnace 555 as described with reference to FIG. 5.

Figure 13:
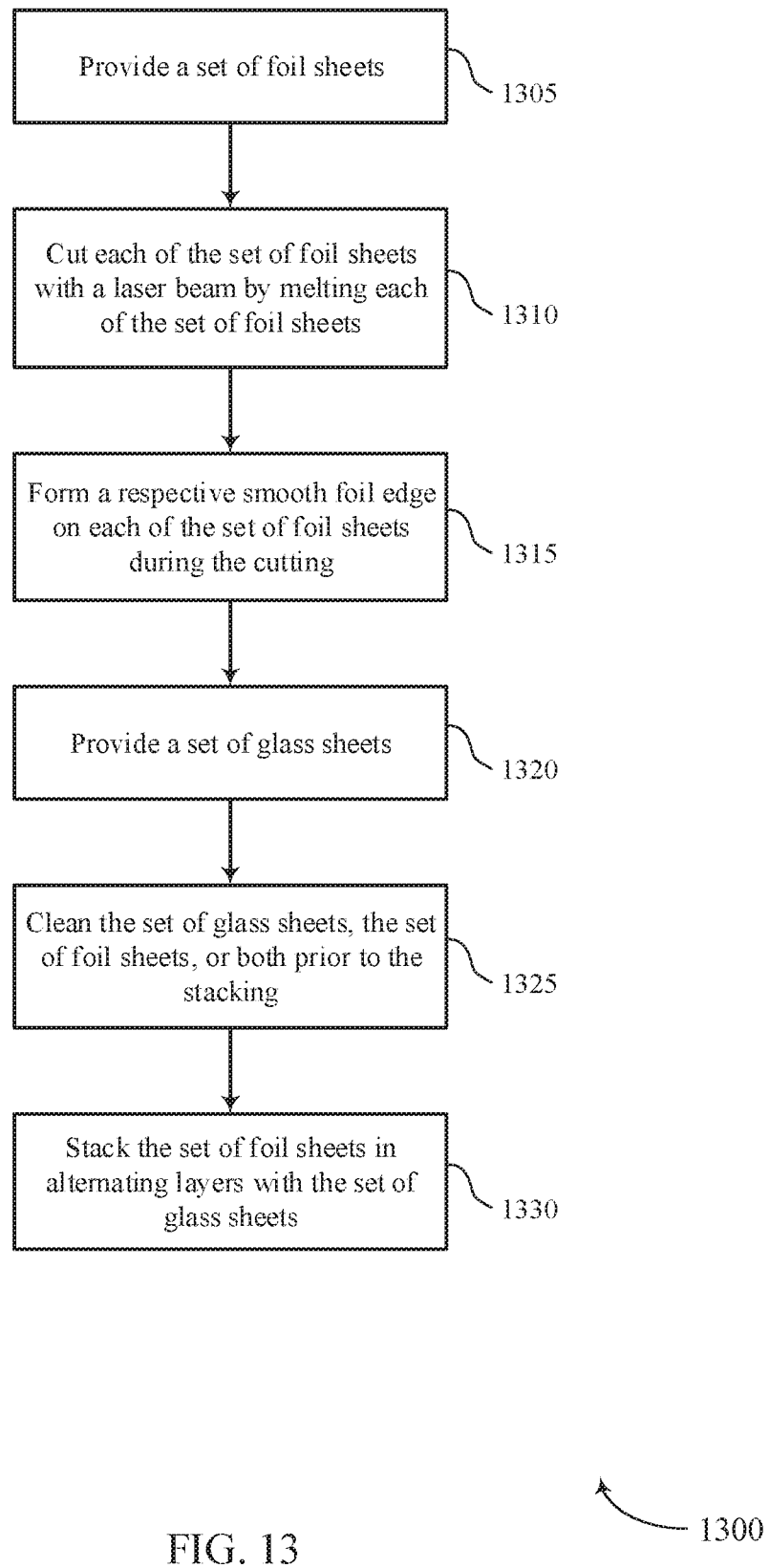

Referring to FIG. 13, shown is a flowchart 1300 of a process for making glass dielectric capacitors using sheets of glass, foil, hybrid metalized glass, or combinations thereof in accordance with aspects of the present disclosure. In some examples, a capacitor manufacturing system may execute a set of codes to control functional elements of the system that perform the described functions. Additionally, or alternatively, a capacitor manufacturing system may use special-purpose hardware.

At block 1305 the capacitor manufacturing system may provide a plurality of foil sheets of 4 micrometers to 25 micrometers thickness. These operations may be performed according to the methods and processes described in accordance with aspects of the present disclosure. For example, the operations may be composed of various substeps, or may be performed in conjunction with other operations described herein. In certain examples, aspects of the described operations may be performed by the foil sheet component 410 and 510 as described with reference to FIGS. 4 and 5.

At block 1310 the capacitor manufacturing system may cut each of the plurality of foil sheets with a laser beam by melting each of the plurality of foil sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1315 the capacitor manufacturing system may form a respective smooth foil edge on each of the plurality of foil sheets during the cutting. These operations may be performed according to the methods and processes described in accordance with aspects of the present disclosure. For example, the operations may be composed of various substeps, or may be performed in conjunction with other operations described herein. In certain examples, aspects of the described operations may be performed by the laser foil cutter 415 and 515 as described with reference to FIGS. 4 and 5.

At block 1320 the capacitor manufacturing system may provide a plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the glass sheet component 420 and 520 as described with reference to FIGS. 4 and 5.

At block 1325 the capacitor manufacturing system may clean the plurality of glass sheets, the plurality of foil sheets, or both prior to the stacking. These operations may be performed according to the methods and processes described in accordance with aspects of the present disclosure. For example, the operations may be composed of various substeps, or may be performed in conjunction with other operations described herein. In certain examples, aspects of the described operations may be performed by the cleaning component 550 as described with reference to FIG. 5.

At block 1330 the capacitor manufacturing system may stack the plurality of foil sheets in alternating layers with the plurality of glass sheets. These operations may be performed according to the methods and processes described in accordance with aspects of the present disclosure. For example, the operations may be composed of various substeps, or may be performed in conjunction with other operations described herein. In certain examples, aspects of the described operations may be performed by the stacking component 425 and 525 as described with reference to FIGS. 4 and 5.

While the invention herein disclosed has been described by means of specific embodiments, examples and applications thereof, numerous modifications and variations could be made thereto by those skilled in the art without departing from the scope of the invention set forth in the claims.

What is claimed is:

1. A method for making glass dielectric capacitors, comprising:
   providing a plurality of foil sheets of 4 micrometers to 25 micrometers thickness;
   cutting each of the plurality of foil sheets with a laser beam by melting each of the plurality of foil sheets;
   forming a respective smooth foil edge on each of said plurality of foil sheets during the cutting;
   providing a plurality of glass sheets; and
   stacking the plurality of foil sheets in alternating layers with the plurality of glass sheets.
2. The method of claim 1, wherein:
   said stacking comprises stacking two or more of said plurality of foil sheets between alternating layers of the plurality of glass sheets.
3. The method of claim 1, further comprising:
   depositing a metalized layer on both sides of each one of the plurality of glass sheets prior to said stacking of said plurality of foil sheets in alternating layers with said plurality of glass sheets.
4. The method of claim 3, wherein:
   said depositing of said metalized layer comprises depositing said metalized layer on an area of each of said plurality of glass sheets that extends beyond an area of each of said plurality of glass sheets juxtaposed respectively to one of said plurality of foil sheets.
5. The method of claim 4, wherein:
   said stacking comprises stacking said plurality of foil sheets in alternating layers with the plurality of glass sheets with said plurality of foil sheets extending out beyond a respective edge of each of said plurality of glass sheets, wherein an extended portion of each of said plurality of foil sheets allows for attachment of a terminal.
6. The method of claim 1, wherein:
   said stacking comprises stacking said plurality of foil sheets in alternating layers with said plurality of glass sheets with said plurality of glass sheets offset from one another.
7. The method of claim 6, further comprising:
   depositing metal on a side of the plurality of glass sheets having been stacked.
8. The method of claim 6, further comprising:
   depositing electrically conductive epoxy on a side of the plurality of glass sheets having been stacked.
9. The method of claim 6, further comprising:
   depositing a conductive layer on a side of the plurality of glass sheets having been stacked.
10. The method of claim 9, further comprising:
    coupling a terminal to said conductive layer.
11. The method of claim 10, further comprising:
    submerging the glass sheets having been stacked in an electrical insulating liquid.
12. The method of claim 11, wherein:
    said submerging comprises submerging under vacuum.
13. The method of claim 11, wherein:
    said submerging comprises submerging said glass sheets having been stacked in a liquid selected from the group of liquids comprising: silicone fluid, mineral oil, synthetic ester, vegetable oil, rapeseed oil, aromatic insulating fluid (such as biphenyls) and combinations thereof.
14. The method of claim 1, further comprising:
    applying a voltage across separate ones of said plurality of foil sheets.
15. The method of claim 14, further comprising:
    applying said voltage across said separate ones of said plurality of foil sheets by pulsing said voltage.
16. The method of claim 14, further comprising:
    applying said voltage under vacuum.
17. The method of claim 1, further comprising:
    coating each of said plurality of glass sheets with polymer coating prior to said stacking.
18. The method of claim 1, further comprising:
    coating each of said plurality of glass sheets with inorganic ceramic coating prior to said stacking.
19. The method of claim 1, further comprising:
    plasma cleaning the plurality of glass sheets and the plurality of foil sheets having been stacked.
20. The method of claim 1, further comprising:
    placing into a vacuum furnace the plurality of glass sheets and the plurality of foil sheets having been stacked.
21. The method of claim 1, further comprising:
    cleaning the plurality of glass sheets prior to said stacking.
22. The method of claim 1, further comprising:
    cleaning the plurality of foil sheets prior to said stacking.

* * * * *